(12) United States Patent
Cheng et al.

(10) Patent No.: US 9,562,928 B2
(45) Date of Patent: Feb. 7, 2017

(54) ACTIVE PROBE POD IN LOGIC ANALYZER

(71) Applicant: Zeroplus Technology Co., Ltd., New Taipei (TW)

(72) Inventors: Chiu-Hao Cheng, New Taipei (TW); Chih-Ming Tsai, New Taipei (TW)

(73) Assignee: ZEROPLUS TECHNOLOGY CO., LTD., New Taipei (TW)

( * ) Notice: Subject to any disclaimer, the term of this patent is extended or adjusted under 35 U.S.C. 154(b) by 119 days.

(21) Appl. No.: 14/575,499

(22) Filed: Dec. 18, 2014

(65) Prior Publication Data

US 2015/0185250 A1 Jul. 2, 2015

Related U.S. Application Data

(60) Provisional application No. 61/920,988, filed on Dec. 26, 2013.

(51) Int. Cl.
*G01R 31/28* (2006.01)
*G01R 23/00* (2006.01)
*G01R 1/067* (2006.01)
*G01R 31/3177* (2006.01)
*G01R 31/319* (2006.01)
*G06F 11/273* (2006.01)

(52) U.S. Cl.
CPC ........... *G01R 1/067* (2013.01); *G01R 1/06766* (2013.01); *G01R 1/06772* (2013.01); *G01R 31/3177* (2013.01); *G01R 31/31905* (2013.01); *G06F 11/2733* (2013.01); *G01R 1/06788* (2013.01)

(58) Field of Classification Search
CPC ....... G01R 23/00; G01R 23/067; G01R 31/28; G01R 31/3177
USPC .................. 324/76.19, 537, 754.03; 714/724
See application file for complete search history.

(56) References Cited

U.S. PATENT DOCUMENTS

| | | | |
|---|---|---|---|
| 2006/0041803 A1* | 2/2006 | Woodward | G01R 31/3177 714/724 |
| 2008/0048639 A1* | 2/2008 | Sutono | G01R 1/06772 324/76.19 |
| 2008/0116919 A1* | 5/2008 | Li | G01R 31/31851 716/121 |

* cited by examiner

*Primary Examiner* — Tung X Nguyen
*Assistant Examiner* — Neel Shah
(74) *Attorney, Agent, or Firm* — Ming Chow; Sinorica, LLC

(57) ABSTRACT

An active probe pod used in a logic analyzer is disclosed. The active probe pod may be connected to the logic analyzer having a FPGA decoder and to a DUT circuit board. The active probe pod may include a LVDS differential ire component connected to the FPGA decoder and a front-end circuit board for capturing a weak signal input from the DUT circuit board. The front-end circuit board is adapted not to transmit the captured weak signal input over a long-distance signal transmission path, which helps minimize interferences with the weak signal input, while outputting a LVDS differential signal to the FPGA decoder for decoding. As the front-end circuit board is used for capturing the weak signal input, which falls within the category of one short-distance signal transmission, the signal reflection may not take place, without affecting the signal quality and/or attenuating the signal strength.

3 Claims, 17 Drawing Sheets

ACTIVE PROBE POD IN LOGIC ANALYZER

The current application claims a domestic priority to the provisional patent application of U.S. Ser. No. 61/920,988 filed on Dec. 26, 2013.

BACKGROUND

1. Technical Field

The present disclosure relates to an active probe pod used in a logic analyzer, in particular, to an active probe pod capable of capturing a weak signal input from a DUT circuit board and transmitting such over a shortened signal transmission path, minimizing the occurrence of the signal reflection, ensuring the signal quality, and avoid the attenuation of the signal.

2. Description of Related Art

In the current digital era, the traditional oscilloscope has been proved unable to measure logic signals in 8-16 and even more channels. Despite the in-circuit emulator (ICE) could help resolve some relevant problems, the software development-oriented ICE could be having hard time handling the actual time sequence-related issues. Plus, considering the ICE could only be exclusively used in certain microcomputer systems the logic analyzer still entrenches as one of the necessary equipments for digital engineers. The logic analyzer could have data illustrated in an organized or structured fashion when displaying the operations of the digital circuitry.

The traditional logic analyzer utilizes a passive probe pod in which signal detection circuitry has been incorporated. When the total capacitance of each channel may be at 16 pF, up to eight channels may be detected at the same time. A passive probe pod 2 shown in FIG. 1A could be a single-end wire and is configured to capture the weak signal input from a DUT circuit board 1 before transmitting the captured weak signal input over a long-distance signal transmission path to an operational amplifier 31, a comparator 32, and an FPGA decoder 33, all of which are disposed inside a logic analyzer 3. The operational amplifier 31 could pre-amplify the weak signal input received by the logic analyzer 3 and the comparator 32 could thereafter output a LVDS differential signal to the FPGA decoder 33 where the decoding of the same is performed.

However, as shown in FIG. 1B the traditional approach could be associated with the following disadvantages:

(1) the weak signal input inevitably would be attenuated after the long-distance transmission over the single-end wire, negatively affecting the signal quality, which in turn undermines the subsequent amplification and the decoding (for example, no data could be decoded or the data loss); and (2) the signal reflection could occur after the long-distance signal transmission for the weak signal input over the single-end wire, also subjecting the amplification and the decoding to the data loss or lack of the data to be decoded.

Accordingly, in order to overcome the above problems it is wise to properly set up the signal transmission path for the weak signal input so that the weak signal is not transmitted over the long-distance transmission path. Further, the weak signal input could be converted into the corresponding differential signal, which may be more suitable for the long-distance transmission, since the differential signal is less susceptible to the interference.

SUMMARY OF THE DISCLOSURE

The present disclosure is to provide an active probe pod for a logic analyzer, which could amplify the weak signal input into the corresponding LVDS differential signal by a front-end circuit board so that the effect arising out of the long-distance signal transmission of may be minimized. In one implementation, the front-end circuit board may be implemented in terms of an LVDS IC or a comparator.

The present disclosure may further include an operational method for an active probe pod for a logic analyzer having. The method may include minimizing the weak signal input to be transmitted over the long-distance signal transmission path. Rather, the method may include further converting the weak signal input to the corresponding differential signal before transmitting the differential signal over the long-distance signal transmission path. In doing so, the approach used in the present disclosure may reduce the occurrence of the signal reflection and the attenuation in the signal, improving the signal quality.

The active probe pod may be connected to an FPGA decoder of the logic analyzer and a DUT (device under test) circuit board. The active probe pod may include: a LVDS differential wire component electrically connected with the FPGA decoder, and a front-end circuit board electrically connected to the DUT circuit board and the LVDS differential wire component for capturing the weak signal input from DUT circuit board. The front-end circuit board may not be required to transmit such weak signal input over the long-distance signal transmission path, in order reduce interferences with weak signal. Rather, the front-end circuit board may directly output the LVDS differential signal to the LVDS differential wire, which in turn may transmit the LVDS differential LVDS signal to the FPGA decoder of the logic analyzer for decoding.

In one implementation, the front-end circuit board may be a LVDS driver for capturing the weak signal input of the DUT board. The LVDS driver may not need to transmit the captured weak signal input over the long-distance signal transmission path to minimize the interferences with the weak signal input, while amplifying the weak signal input and comparing the amplified weak signal input and the original weak signal input, before outputting the LVDS differential signal to the LVDS different wire component.

In one implementation, the frequency of the weak signal input received by the LVDS driver may be less than 400 MHZ.

In one implementation, the voltage level of the weak signal input received by the LVDS driver may be greater than 2V, enabling the LVDS driver to properly operate.

In one implementation, the front-end circuit board may be the comparator including a signal interception module for capturing/intercepting the weak signal input of the DUT circuit board. Similarly, the signal interception module may not need to transmit the captured/intercepted weak signal input from the DUT circuit board using the single-end wire over the long-distance transmission, to minimize the impact associated with the long-distance transmission upon the weak signal input. The comparator may further include an impedance matching module electrically connected to the signal interception module for performing impedance matching for the weak signal input. The comparator may also include a comparator module connected to the signal interception module and the LVDS differential wire component for receiving the captured weak signal input from the signal interception module before outputting the LVDS differential signal to the LVDS differential wire component. The comparator may also include a voltage adjusting module connected to the comparator module for preparing the suitable input reference voltage based on the input voltage of the weak signal input and comparing the adjusted input reference voltage and the input voltage before the proper LVDS differential signal may be outputted to the LVDS differential wire component. The LVDS differential wire component may be responsible for outputting the LVDS differential signal to the FPGA decoder where the corresponding decoding takes place. The comparator module may also include an output stabling module connected to the comparator module for stabling the output voltage of the LVDS differential signal. When the output stabling module detects the input voltage of the weak signal input jitters around the reference voltage, the output stabling module may cause the comparator not to change the output voltage, ensuring the LVDS differential signal to remain unaffected.

More specifically, the frequency of the weak signal input received by the comparator is less than 400 MHz.

More specifically, the active probe pod may further include a differential input-single end output signal converter, which may be electrically coupled to the FPGA decoder and the LVDS differential wire component. The front-end circuit board may be a single end input-differential output circuitry module. Such single end input-differential output circuitry module may include a signal interception module for capturing/intercepting the weak signal input of the DUT circuit board. The signal interception module may not need to transmit the captured/intercepted weak signal input from the DUT circuit board over the long-distance transmission, to minimize the impact associated with the long-distance transmission upon the weak signal input. The single end input-differential output circuitry module may also include a voltage adjusting module connected to the signal interception module for preparing one suitable single end signal input based on the input voltage of the captured weak signal input. The single end input differential output circuitry module may further include an impedance matching module electrically connected to the signal interception module for performing impedance matching for the weak signal input. The single end input differential output circuitry module may also include a differential mode circuitry adjusting module connected to the signal interception module and the LVDS differential wire component for receiving the captured weak signal input from the signal interception module before outputting the LVDS differential signal to the differential input-single end output signal converter, which may convert the LVDS differential signal to the single end input signal. The single end input signal may be further delivered to the FPGA decoder where the corresponding decoding takes place.

More specifically, the front-end circuit board may be a differential input adjustor. The differential input adjustor may include a front-end LVDS differential wire component for capturing/intercepting the weak signal input of the DUT circuit board. The front-end LVDS differential wire component may not need to transmit the captured/intercepted weak signal input from the DUT circuit board over the long-distance transmission, to minimize the impact associated with the long-distance transmission upon the weak signal input. The differential input adjustor may also include an impedance matching module electrically connected to the front-end LVDS differential wire component for performing impedance matching for the weak signal input. The differential input adjustor may also include a differential mode circuitry adjusting module connected to the front-end LVDS differential wire component and the LVDS differential wire component for receiving the captured weak signal input from the signal interception module before outputting one amplified LVDS differential signal to the LVDS differential wire component. The LVDS differential wire component may be responsible for outputting the LVDS differential signal to the FPGA decoder where the corresponding decoding takes place.

For further understanding of the present disclosure, reference is made to the following detailed description illustrating the embodiments and examples of the present disclosure. The description is only for illustrating the present disclosure, not for limiting the scope of the claim.

BRIEF DESCRIPTION OF THE DRAWINGS

The drawings included herein provide further understanding of the present disclosure. A brief introduction of the drawings is as follows.

DESCRIPTION OF THE EXEMPLARY EMBODIMENTS

The aforementioned and other technical contents, features, and efficacies will be shown in the following detail descriptions of a preferred embodiment corresponding with the reference Figures.

Figure 2:
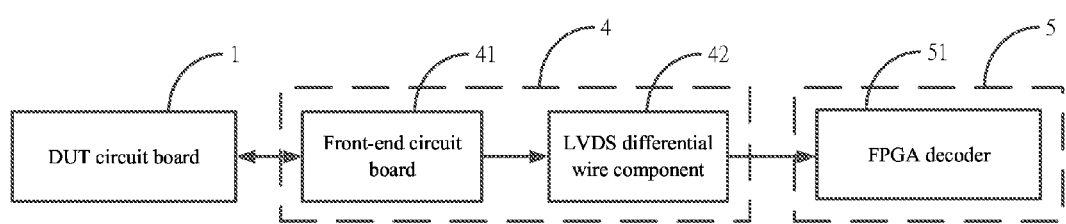
FIG. 2 shows a structural diagram of an active probe pod in a logic analyzer according to one embodiment of the present disclosure.

Please refer to FIG. 2 of a structural diagram of an active probe 4 for a logic analyzer 5. The active probe 4 may be coupled to the logic analyzer 5 having an FPGA decoder 51 and a DUT (device to be tested) circuit board 1. The active probe 4 may include a front-end circuit board 41 and a LVDS differential wire component 42. The front-end circuit board 41 may be coupled to the LVDS differential wire component 42 and the DUT circuit board 1. The front-end circuit board 41 may be adapted to capture one weak signal input from the DUT board 1 and output the captured weak signal input in terms of a LVDS differential signal to the LVDS differential wire component 42 without utilizing a long-distance signal transmission path, therefore minimizing the implication associated with the weak signal input. The LVDS differential signal may thereafter be transmitted to the logic analyzer 5 by the LVDS differential wire component 42, in order to be decoded by the FPGA decoder 51.

Figure 3A:
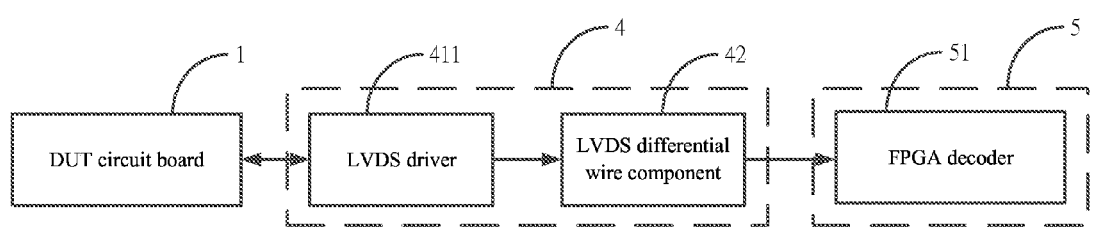
FIG. 3A shows a structural diagram an active probe pod in the logic analyzer according to another embodiment of the present disclosure.
Figure 3B:
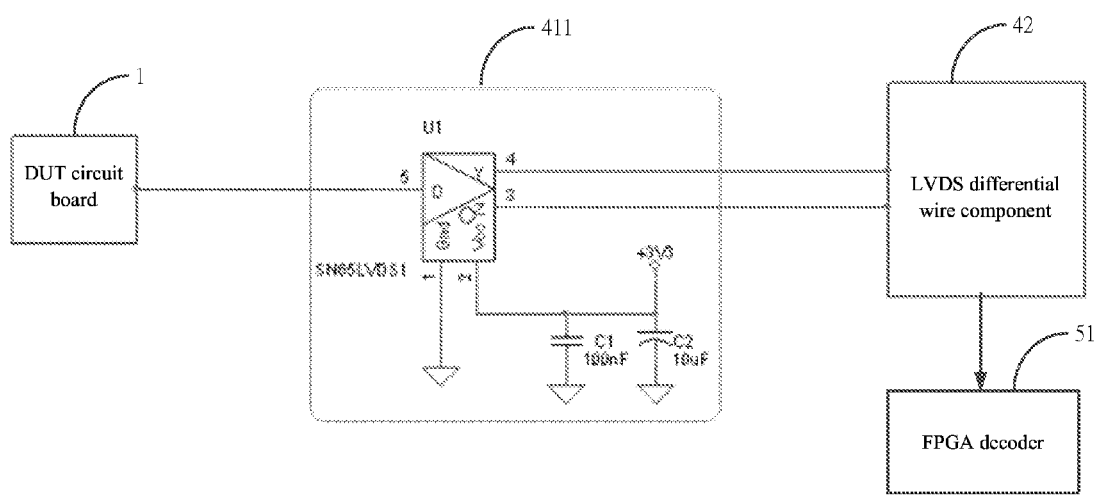
FIG. 3B shows a circuitry diagram of the embodiment in FIG. 3A.
Figure 3C:
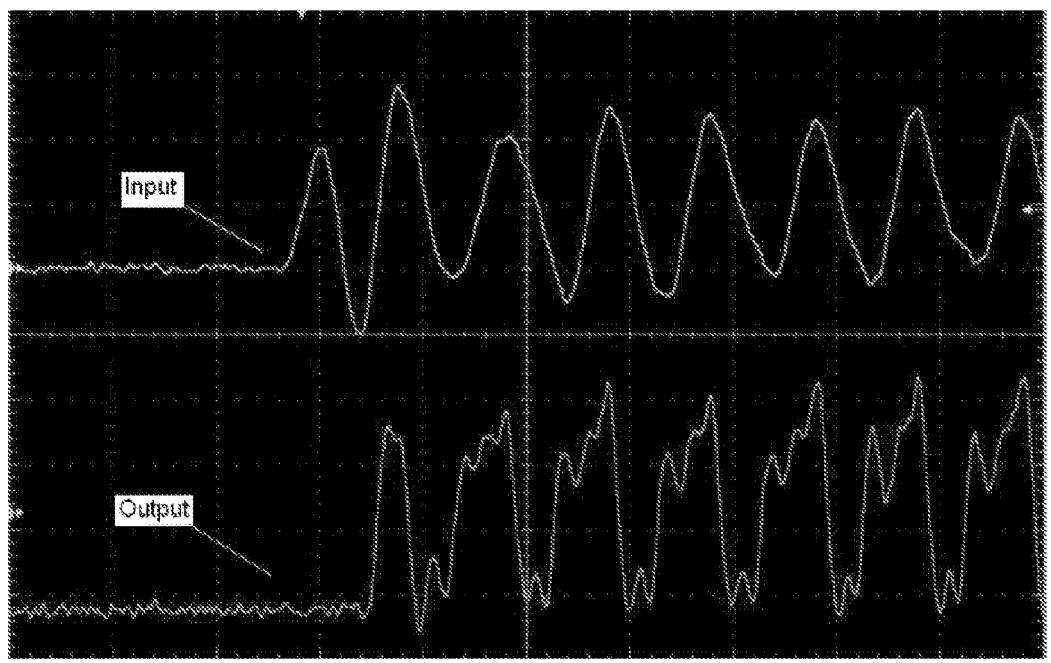
FIG. 3C shows input and output waveforms of the embodiment in FIG. 3A.

The present disclosure may include at least two embodiments described in FIGS. 3A and 3B, respectively. As shown in FIG. 3A, a front-end circuit board 411 may be implemented in terms of a LVDS driver, which may be used to capture the weak signal input from the DUT circuit board without employing any long-distance signal transmission path, so as to minimize the implication of the weak signal input. Specifically, the LVDS driver 411 may amplify the weak signal input and compare the amplified signal input and the original signal input before outputting the LVDS differential signal to the LVDS differential wire component 42. In one implementation, TI SN65LVDS1 is used as the LVDS driver 411 and therefore may only be suitable in the case of the weak signal input that is less than 250 MHz in frequency and larger than 2 Volts in voltage. Meanwhile, the FPGA decoder 51 could be XILINX VIRTEX6, and as previously mentioned the LVDS differential wire component 42 may be functioned to transmit the LVDS differential signal to the FPGA decoder 51.

Figure 1A:
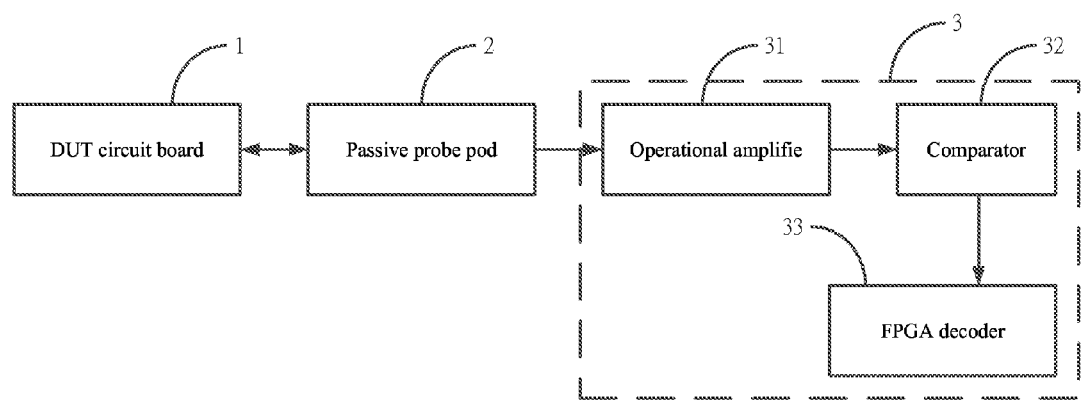
FIG. 1A shows a structural diagram of a traditional passive probe pod in a logic analyzer.

Compared with FIG. 3A and FIG. 1A, the embodiment shown in FIG. 1A may utilize a single end wire as a passive probe end while THS3202 is used as an operational amplifier 31, ADCMP562 is used as a comparator 32, and XILINX VIRTEX6 functions as a FPGA decoder 33. Illustrated in FIG. 1B, the passive probe pod 2 may measure output waveforms between the comparator 32 and the FPGA decoder 33, while the active probe pod may measure output waveforms between the LVDS differential wire component 42 and the FPGA decoder 51 at the logic analyzer 5.

Figure 1B:
FIG. 1B shows input and output waveforms of the traditional probe pod in the logic analyzer.

Since the weak signal input from the DUT circuit board 1 may be 200 MHz in frequency, as shown in FIG. 1B the output signal may be associated with the data loss and the waveform thereof may still have some to be desired (e.g., significant reflection). On the other hand, with the same signal input from the DUT circuit board 1 (i.e., 200 MHz in frequency), the output signal shown in FIG. 3B may only subject to minimum data loss or may be even without any data loss while no reflection in waveform has been present.

The use of LVDS driver 411 as the active probe pod compared with its conventional counterpart 2 has the following advantages:

(1) effectively cutting short the signal transmission path for the weak signal input (30 centimeters in the conventional passive probe pod versus 2 centimeters from the DUT circuit board to the LVDS driver 411 realized by the use of the LVDS driver 411), leading to the waveform without any reflection and therefore improving signal quality;

(2) remaining advantageous disregarding the length of the signal transmission path of the differential signal (from the LVDS driver 411 to the FPGA decoder 51) after effectively shortening the signal transmission path for the weak signal input from the DUT circuit board 1, which has been reduced to 2 centimeters, without attenuating the signal transmitted from the LVDS driver 411 into the FPGA decoder 51;

(3) being more beneficial because of less signal transmission path for the weak signal input despite longer in the signal transmission path for the differential signal while the conventional arts just do completely opposite (i.e., longer signal transmission path for the weak signal input and shorter one for differential signal);

(4) requiring none of the inputted reference voltage and any mechanism for adjusting the same in the present disclosure (the logic analyzer 5 is not equipped with the comparator), when the input reference voltage is necessary in the traditional approaches where the comparison between the input voltage and the input reference voltage is required; and (5) that active probe pod 4 may singlehandedly adjust the input reference ($V_{ref}$) that had not been thought of or disclosed in the conventional arts.

Figure 4A:
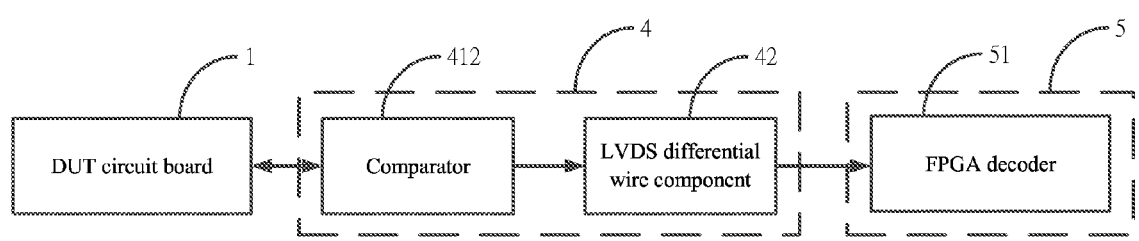
FIG. 4A shows another structural diagram of another active probe pod in the logic analyzer according to another embodiment of the present disclosure.
Figure 4B:
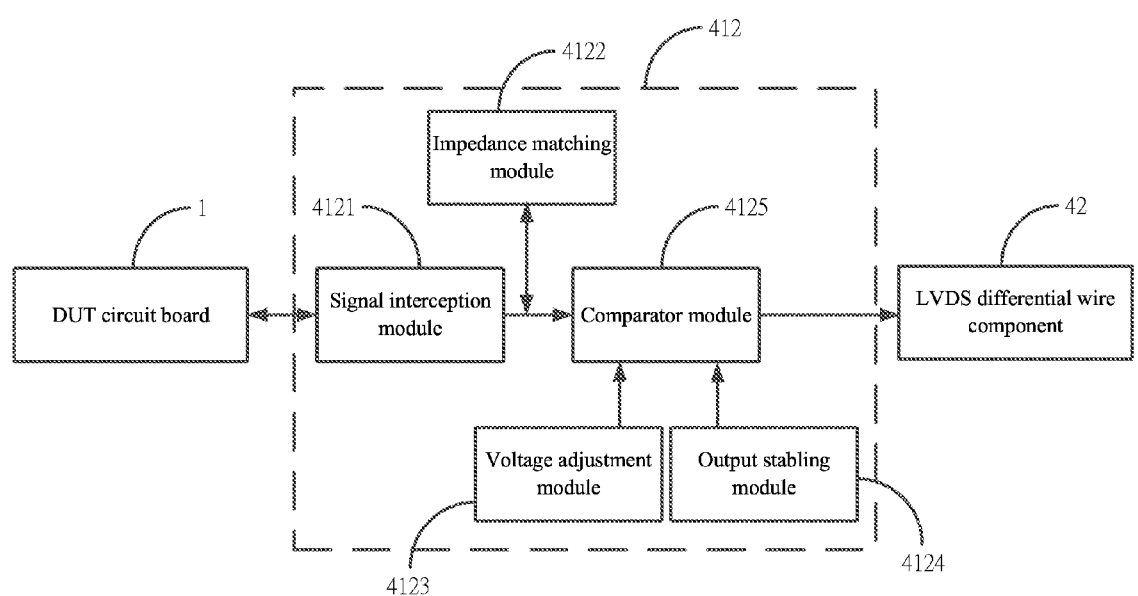
FIG. 4B shows a structural diagram of a comparator in the embodiment in FIG. 4A.
Figure 4C:
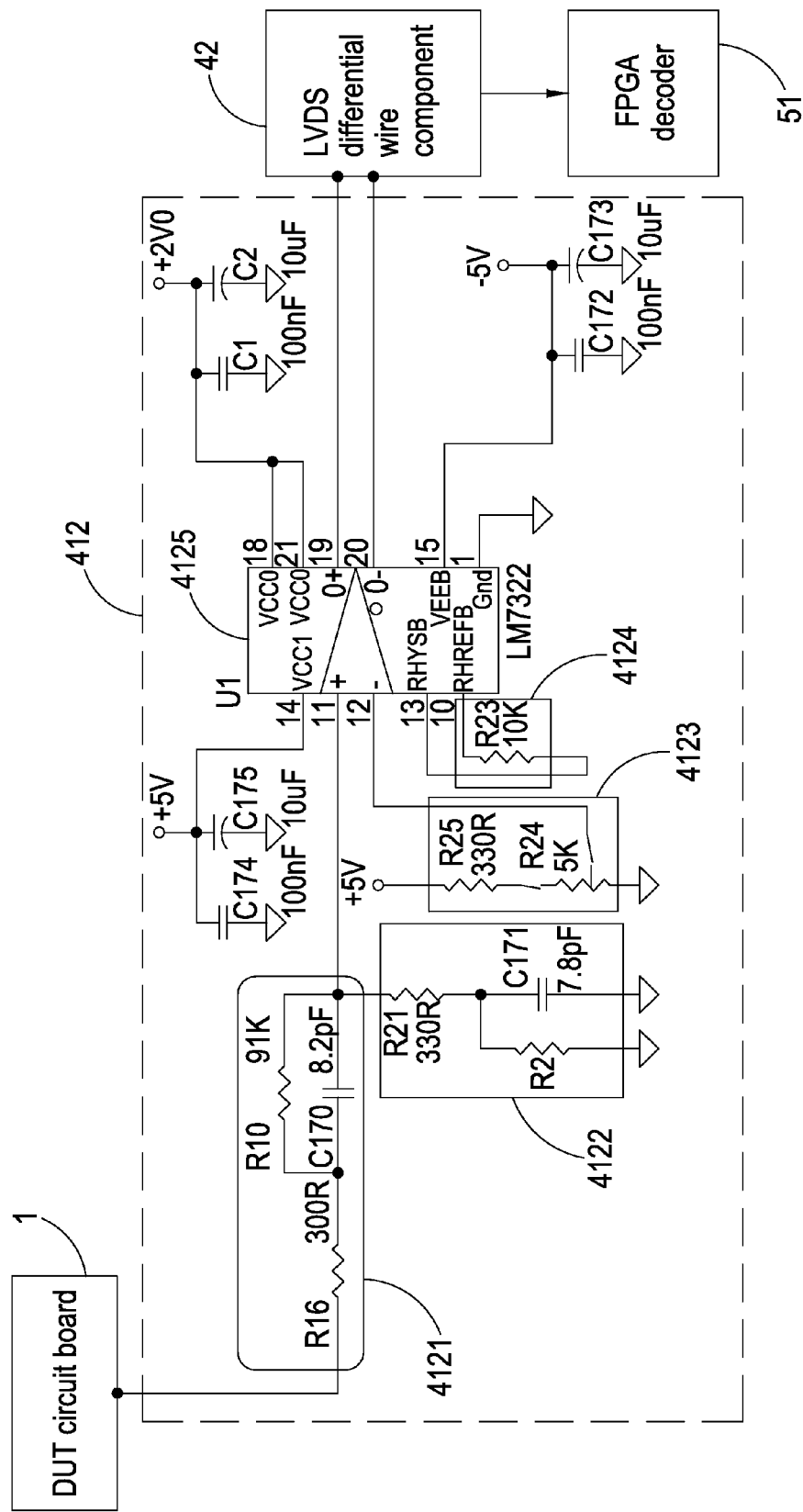
FIG. 4C shows a circuitry diagram of the embodiment in FIG. 4A.

FIGS. 4A to 4C show the second embodiment of the present disclosure. The second embodiment may include a comparator 412 as the front-end circuit board. The comparator 412 may include a signal interception module 4121 (Tip Hybrid), an impedance matching module 4122 (Termination Hybrid), a voltage adjusting module 4123 (Reference Voltage), an output stabling module 4124 (Hysteresis) and a comparator module 4125. The signal interception module 4121 may be used to intercept the weak signal input from the DUT board 1. The signal interception module 4121 may not need to transmit the intercepted signal over the long-distance signal transmission path, which may minimize the impact of the same on the weak signal input. Plus, the impedance matching module 4122 may be used to perform the impedance matching for the intercepted signal transmitted by the signal interception module 4121.

The comparator module 4125 may be connected to the signal interception module 4121 and the LVDS differential wire component 42, for receiving the intercepted weak signal input before outputting the LVDS differential signal to the LVDS differential wire component 42. Meanwhile, the voltage adjusting module 4123 may based on the voltage level of the intercepted weak signal input prepare one suitable LVDS differential signal to the LVDS differential wire component 42, which may in turn relay the same to the logic analyzer 5. Thus, the FPGA decoder 51 may decode the LVDS differential signal. In addition, to stabilize the LVDS differential signal the output stabling module 4124 when detecting the voltage level of the weak signal input jitters around the reference voltage may control the comparator module 4125 not to change its output voltage. Consequently, the outputted LVDS differential signal may remain unaffected.

Compared with FIG. 4A and FIG. 1A, the embodiment shown in FIG. 1B may utilize a single end wire as a passive probe end while THS3202 is used as an operational amplifier 31, ADCMP562 is used as a comparator 32, XILINX VIRTEX6 functions as a FPGA decoder 33. Traditionally, the passive probe pod 2 may measure the waveform between the comparator 32 and the FPGA decoder 33 but in the present disclosure the active probe pod 4 may be used to measure the waveform between the LVDS driver 411 and the LVDS differential wire component 42.

Figure 4D:
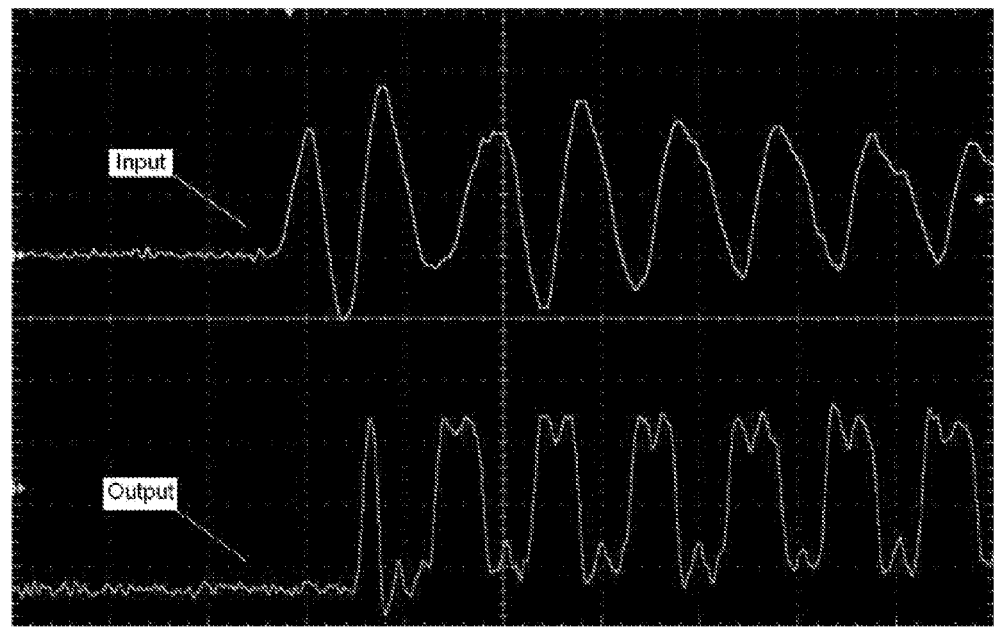
FIG. 4D shows input and output waveforms of the embodiment in FIG. 4A.

Since the signal input from the DUT circuit board 1 may be 200 MHz in frequency, as shown in FIG. 1B the output signal may be associated with the data loss and the waveform thereof may still have some to be desired (e.g., significant reflection). On the other hand, with the same signal input from the DUT circuit board 1 (i.e., 200 MHz in frequency), the output signal shown in FIG. 4D may only subject to minimum data loss or even without any data loss while no reflection in waveform has been present.

The present disclosure generally employs typical differential cables such as USB 2.0/3.0 or HDMI wires in the logic analyzer, for addressing issues of interferences of high-frequency signals in the traditional single end wires and being not suitable for the long-distance transmission of the high-frequency signals. Additionally, that the differential cables may be used in signal transmission of signals of at least 10 GHz in frequency renders beneficial the usage of the differential cables.

The use of the comparator 412 as the active probe pod 4 compared with its conventional counterpart 2 has the following advantages:

(1) effectively cutting short the signal transmission path for the weak signal (30 centimeters in the conventional passive probe pod versus 2 centimeters from the DUT circuit board to the comparator 412 realized by the use of the comparator 412), leading to the waveform without any reflection and therefore improving the signal fidelity;

(2) remaining advantageous disregarding the length of the signal transmission path of the differential signal (from the comparator 412 to the FPGA decoder 51) after effectively shortening the signal transmission path for the weak signal input from the DUT circuit board 1, which has been reduced to 2 centimeters, without attenuating the signal transmitted from the comparator 412 into the FPGA decoder 51;

(3) being more beneficial because of less signal transmission path for the weak signal input despite longer in the signal transmission path for the differential signal while the conventional arts just do completely opposite (i.e., longer signal transmission path for the weak signal input and shorter one for differential signal);

(4) maintaining the output voltage at the substantially same level by the output stabling module 4124 when the voltage level of the input voltage jitters around the input reference voltage with the adjustment to the hysteresis voltage realized by the changes to the external resistance; and (5) properly adjusting the input reference voltage by the voltage adjusting module 4123 since the comparator 412 is adapted to compare the input voltage and the input reference voltage, which is required and needs to be adjusted in accordance with the voltage level of the input voltage, so as to prepare the suitable output.

The previous examples may focus on the measurement of high-frequency signals. The present disclosure may be used in contexts of low-frequency signal and differential signal measurement as shown in two examples in below. FIGS. 5A-5D may be for the low-frequency measurement with each of low-frequency signals inputted into its correspondingly independent channel before being intercepted or captured (single end to single end). In the current embodiment, the front-end circuit board may be implemented in terms of a differential output-single end input circuitry module 413 having a signal interception module 4131, a voltage adjusting module 4132, an impedance matching module 4133, and a differential mode circuitry adjusting module 4134. The signal interception module 4131 may be used to capture the weak signal input from the DUT circuit board 1 without transmitting the same over the long-distance transmission path, so as to minimize the corresponding impact on the weak signal input. The voltage adjusting module 4132 may enable the differential mode circuitry adjusting module 4134 based on the input voltage of the weak signal input to prepare the suitable single end (input) signal.

Figure 5A:
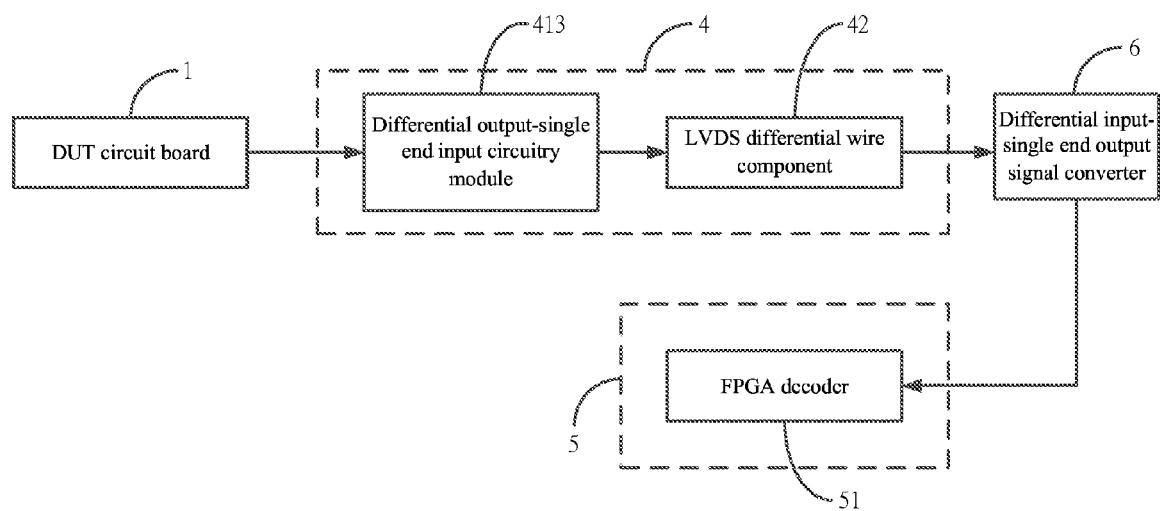
FIG. 5A shows another structural diagram of another active probe pod in the logic analyzer according to another embodiment of the present disclosure.
Figure 5B:
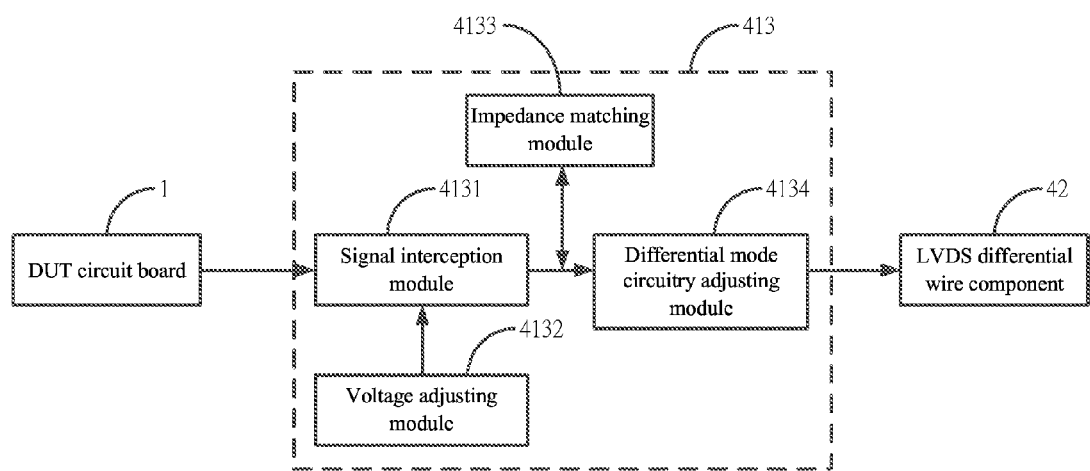
FIG. 5B shows a structural diagram of a single end input differential output adjustor of the embodiment in FIG. 5A.
Figure 5C:
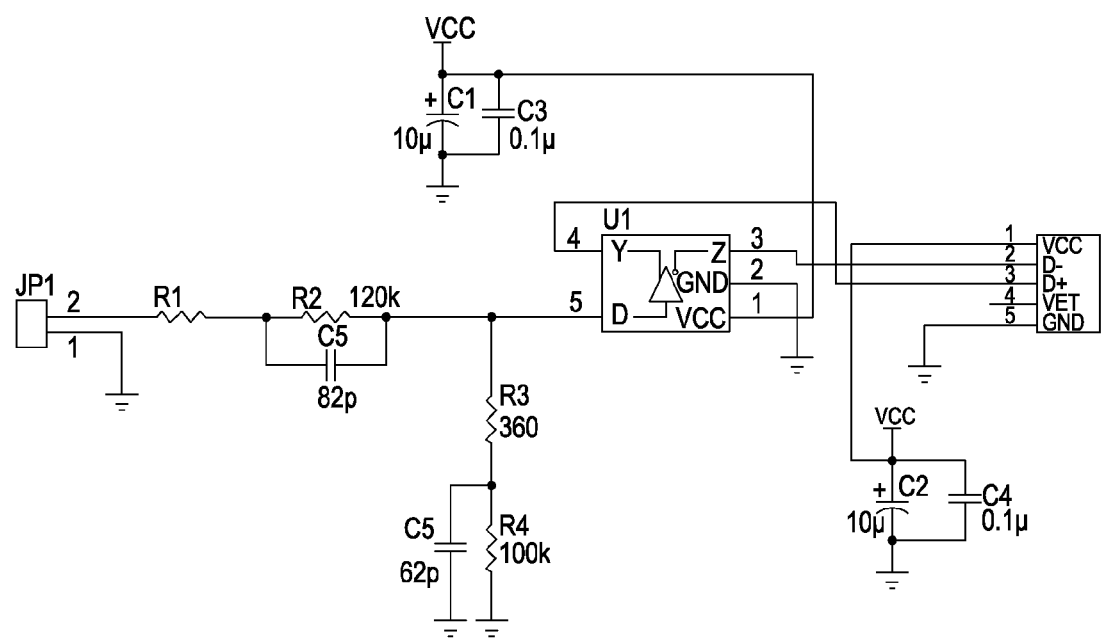
FIG. 5C shows a circuitry diagram of a single end input differential output circuitry module of the embodiment in FIG. 5A.
Figure 5D:
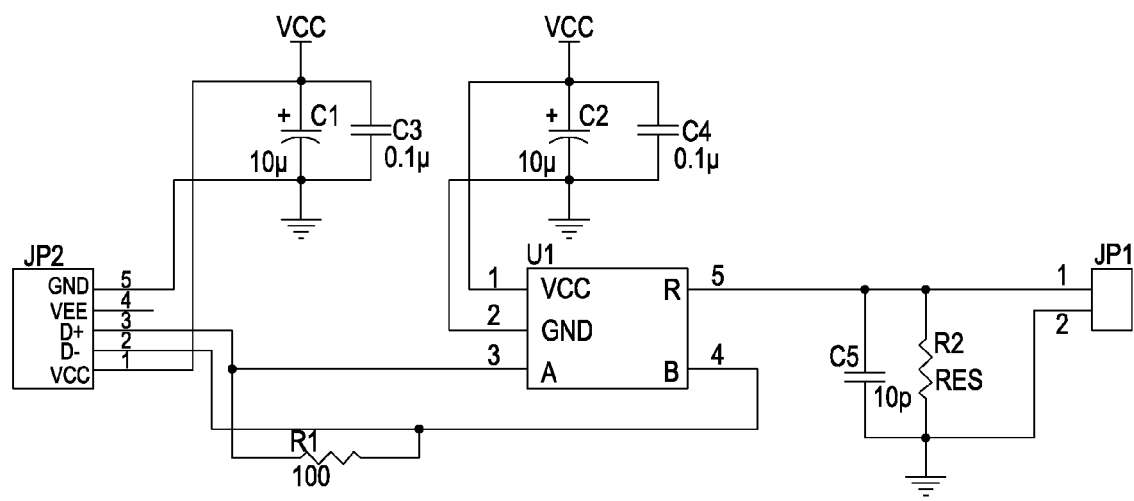
FIG. 5D shows another circuitry diagram of a single end input differential output circuitry module of the embodiment in FIG. 5A.

Before the weak signal input may be inputted into the differential mode circuitry adjusting module 4134, such weak signal input may go through the impedance matching module 4133, which may be used to match the impedance for the weak signal input. Thereafter, as shown in FIG. 5B and FIG. 5C, the differential mode circuitry adjusting module 4134 may receive the captured weak signal input from the signal interception module 4131 before outputting one LVDS differential signal to the LVDS differential signal wire component 42. Thereafter, as shown in FIG. 5A and FIG. 5D, the logic analyzer 5 may be further coupled to a differential input-single end output signal converter 6, which may be electrically coupled to both the FPGA decoder 51 and the LVDS differential wire component 42. The LVDS differential wire component 42 may transmit the LVDS differential signal to the differential input-single end output signal converter 6, which may convert the LVDS differential signal to the single end signal. The single end signal may be further transmitted to the FPGA decoder 51 of the logic analyzer 5 where the corresponding decoding occurs. In another implementation, the differential input-single end output signal converter 6 may be disposed on the logic analyzer 5.

Figure 6A:
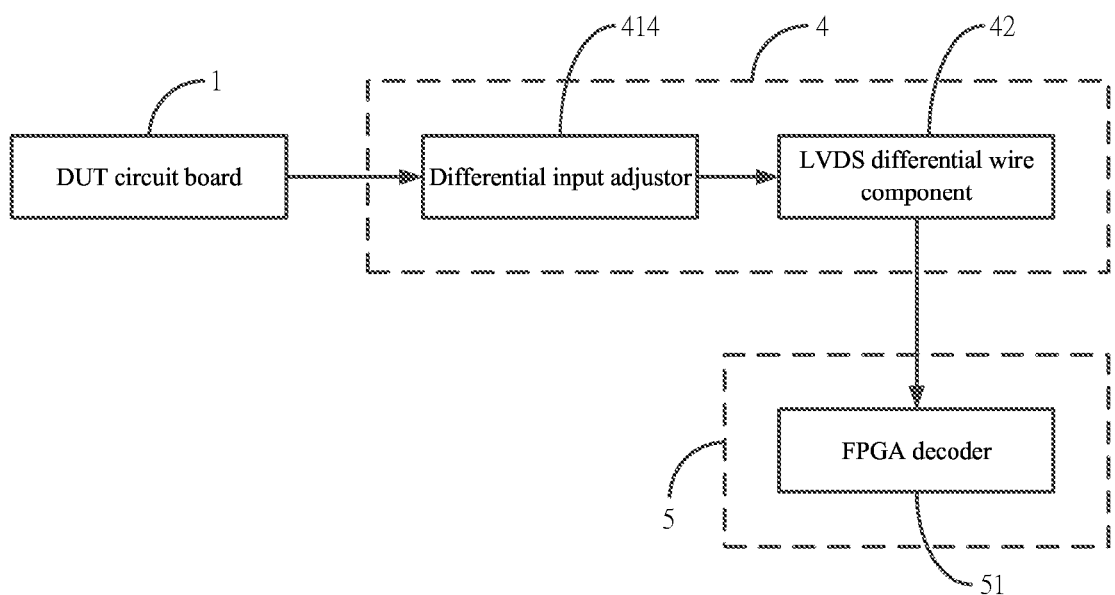
FIG. 6A shows another structural diagram of another active probe pod in the logic analyzer according to another embodiment of the present disclosure.
Figure 6B:
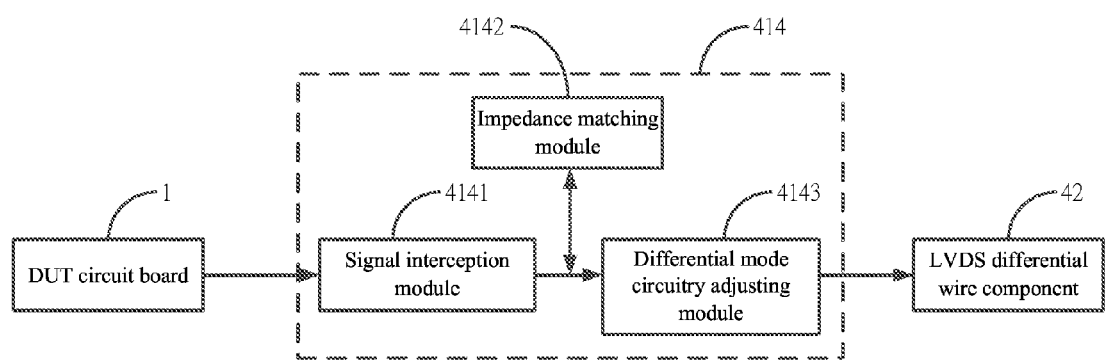
FIG. 6B show a structural diagram of a differential input adjustor of the embodiment in FIG. 6A.
Figure 6C:
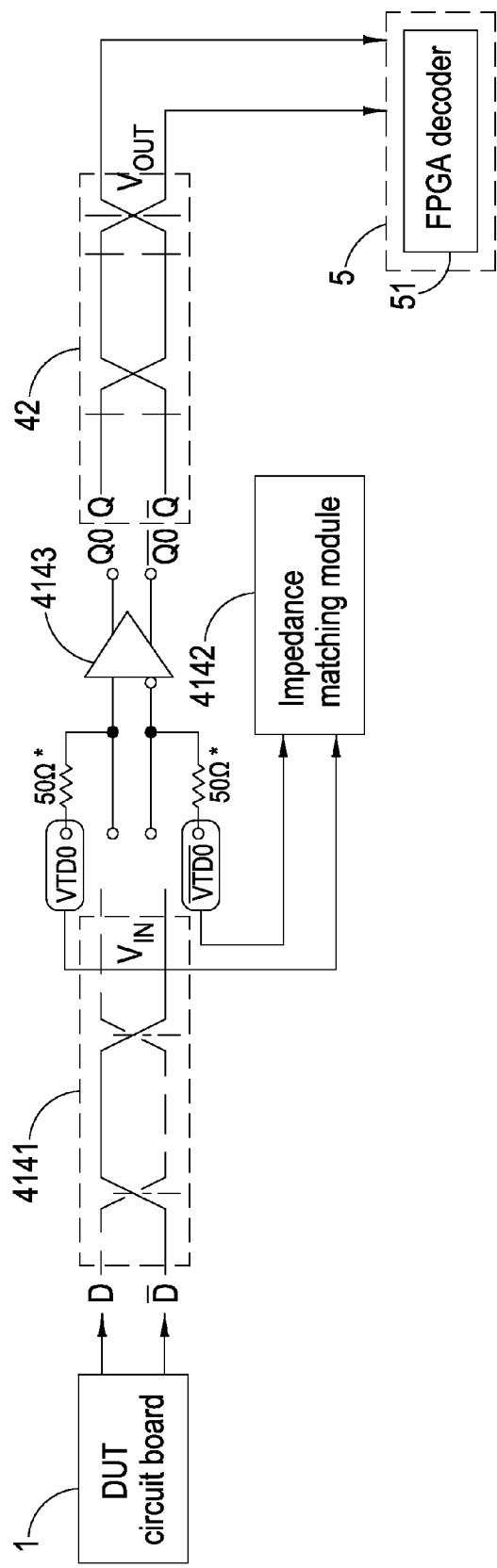
FIG. 6C shows a part of circuitry of the embodiment in FIG. 6A.

In the event the difference between signals at two channels is captured, the scheme in FIGS. 6A-C may be employed. As shown in FIGS. 6A to 6C, the front-end circuit board may be implemented in terms of a differential input adjustor 414. In addition to a differential mode circuitry adjusting module 4143, the differential input adjustor 414 may include a front-end LVDS differential wire component 4141 and an impedance matching module 4142. For the operation in the differential mode, the front-end LVDS differential wire component 4141 may be necessary for capturing the weak signal input from the DUT circuit board 1. The front-end LVDS differential wire component 4141 may not transmit such weak signal input over the long-distance signal transmission path to reduce the corresponding impact on the weak signal input.

Before the weak signal input is delivered to the differential mode circuitry adjusting module 4143, the weak signal input may go through the impedance matching module 4142, which may perform the corresponding impedance matching for the weak signal input. The differential mode circuitry adjusting module 4143, meanwhile, may be used to receive the weak signal input captured by the front-end LVDS differential wire component 4141 and output one LVDS differential signal to the LVDS differential wire component 42, which may in turn transmit the LVDS differential signal to the FPGA decoder 51 of the logic analyzer 5.

When in comparison with the traditional arts, the active probe pod provided in the present disclosure is advantageous because: (1) the weak signal input is not transmitted over the long-distance signal transmission path and the weak signal input is converted by the corresponding differential signal, which may be suitable for the long-distance signal transmission, ensuring the quality of the signal (e.g., minimizing the occurrence of the signal reflection and the attenuation); (2) the interference with the weak signal input that is transmitted over the traditional single-end measurement components at the high speed could be largely reduced, and the measurement of the signal that is less than 400 MHz is satisfactory since the LVDS driver or the comparator is adopted as the active probe pod; and (3) the limitation on the transmission distance and the bandwidth could be removed when the LVDS differential wire component is used for facilitating the signal transmission for the front-end measurement of the logic analyzer with the present disclosure applicable in the high-frequency signal, low-frequency signal, and differential signal measurements.

Some modifications of these examples, as well as other possibilities will, on reading or having read this description, or having comprehended these examples, will occur to those skilled in the art. Such modifications and variations are comprehended within this disclosure as described here and claimed below. The description above illustrates only a relative few specific embodiments and examples of the present disclosure. The present disclosure, indeed, does include various modifications and variations made to the structures and operations described herein, which still fall within the scope of the present disclosure as defined in the following claims.

What is claimed is:

1. An active probe pod used in a logic analyzer having a field-programmable gate array (FPGA) decoder, the active probe pod connected to the field-programmable gate array (FPGA) decoder and a device under test (DUT) circuit board, the active probe pod comprising:

a low-voltage differential signaling (LVDS) differential wire component connected to the field-programmable gate array (FPGA) decoder; and a front-end circuit board connected to the DUT circuit board and the low-voltage differential signaling (LVDS) differential wire component for capturing a signal input from the DUT circuit board and transmitting the signal input over a short-distance transmission path to minimize interferences with the signal input, before outputting a low-voltage differential signaling (LVDS) differential signal to the low-voltage differential signaling (LVDS) differential wire component, which in turn transmits the low-voltage differential signaling (LVDS) differential signal to the field-programmable gate array (FPGA) decoder;

wherein the front-end circuit board is a comparator, and the comparator comprises a signal interception module for capturing the signal input from the DUT circuit board and transmitting the signal input over the short-distance transmission path to minimize the interferences with the signal input, an impedance matching module connected to the signal interception module for performing impedance matching on the signal input, a comparator module connected to the signal interception module and the low-voltage differential signaling (LVDS) differential wire component for receiving the signal input from the signal interception module and outputting the low-voltage differential signaling (LVDS) differential signal to the low-voltage differential signaling (LVDS) differential wire component, a voltage adjusting module connected to the comparator module for adjusting a reference voltage based on an input voltage of the signal input, which is compared with an input voltage, to output the low-voltage differential signaling (LVDS) differential signal to the field-programmable gate array (FPGA) decoder where corresponding decoding takes place, and an output stabilizing module connected to the comparator module for stabilizing an output voltage of the low-voltage differential signaling (LVDS) differential signal and controlling the comparator not to trigger the change to the output voltage when the input voltage of the signal input jitters around the reference voltage so as to ensure the low-voltage differential signaling (LVDS) differential signal remains unaffected.

2. The active probe pod according to claim 1, wherein the signal input received by the comparator is less than 400 MHz in frequency.

3. The active probe pod according to claim 1, further comprising a differential input-single end output signal converter, which is electrically coupled to the field-programmable gate array (FPGA) decoder and the low-voltage differential signaling (LVDS) differential wire component, while the front-end circuit board is a single end output circuit module having a signal interception module for capturing the signal input from the DUT circuit board and transmitting the signal input over the short-distance transmission path to minimize the interferences with the signal input, an impedance matching module connected to the signal interception module for performing impedance matching on the signal input, a differential mode circuitry adjusting module connected to the signal interception module and the low-voltage differential signaling (LVDS) differential wire component for receiving the signal input from the signal interception module and outputting the low-voltage differential signaling (LVDS) differential signal to the low-voltage differential signaling (LVDS) differential wire component, which in turn transmits the low-voltage differential signaling (LVDS) differential signal to the differential input-single end output signal converter to convert the low-voltage differential signaling (LVDS) differential signal to a single end signal before having the signal end signal to be transmitted to the field-programmable gate array (FPGA) decoder where corresponding decoding takes place, and a voltage adjusting module connected to the signal interception module for ensuring a suitable signal input based on an input voltage of the signal input.

* * * * *